United States Patent
Fujita et al.

(10) Patent No.: US 6,469,750 B1
(45) Date of Patent: Oct. 22, 2002

(54) AUTOMATIC FINE-TUNING CONTROL VOLTAGE GENERATING CIRCUIT HAVING LEVEL SHIFT CIRCUIT

(75) Inventors: Ryuusuke Fujita; Akira Kawamura, both of Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/453,144

(22) Filed: Dec. 2, 1999

(30) Foreign Application Priority Data

Dec. 14, 1998 (JP) .......................................... 10-354691

(51) Int. Cl.[7] ................................................. H04H 5/50
(52) U.S. Cl. ..................... 348/731; 348/733; 455/182.3
(58) Field of Search ................................. 348/731, 732, 348/733, 735, 737; 455/182.3, 184.1, 185.1; H04H 5/50

(56) References Cited

U.S. PATENT DOCUMENTS

| | | | | |
|---|---|---|---|---|
| 4,819,069 A | * | 4/1989 | Tanaka | 348/731 |
| 5,132,799 A | * | 7/1992 | Gakumura | 348/731 |
| 6,233,023 B1 | * | 5/2001 | Hatano | 348/731 |
| 6,252,630 B1 | * | 6/2001 | Kusumi et al. | 348/460 |

FOREIGN PATENT DOCUMENTS

| JP | 5-344445 | 12/1993 |
|---|---|---|
| JP | 7-115602 | 5/1995 |

* cited by examiner

*Primary Examiner*—Michael H. Lee
(74) *Attorney, Agent, or Firm*—Brinks Hofer Gilson & Lione

(57) ABSTRACT

An automatic fine-tuning control (AFT) voltage generating circuit is provided in which a general-purpose integrated circuit for an intermediate frequency (IF IC) is used, which is capable of easily detecting a low level point in a simple manner without increasing the manufacturing cost. The automatic fine-tuning control voltage generating circuit includes a surface-acoustic-wave (SAW) filter for filtering an intermediate video frequency signal; an IF IC, connected to the SAW filter, for detecting the filtered intermediate video frequency signal and for generating an AFT voltage; and a level shift circuit, connected to the IF IC, for shifting the non-signal-time level of the automatic fine-tuning control voltage generated by the IF IC toward a direction in which the level is lower than an intermediate level between a high level and a low level.

2 Claims, 4 Drawing Sheets

A = 200ms

AUTOMATIC FINE-TUNING CONTROL VOLTAGE GENERATING CIRCUIT HAVING LEVEL SHIFT CIRCUIT

BACKGROUND OF THE INVENTION

1. Field of the Invention

The present invention relates to an automatic fine-tuning control voltage generating circuit. More particularly, the present invention relates to an automatic fine-tuning control voltage generating circuit having a level shift circuit for shifting, toward a lower level, a non-signal-time level of an automatic fine-tuning control voltage output from an integrated circuit for an intermediate frequency to which an intermediate video frequency signal which is filtered by a SAW (surface acoustic wave) filter is supplied.

2. Description of the Related Art

Hitherto, in a television receiver, etc., comprising an electronic tuner, when the electronic tuner is automatically preset-tuned or automatically search-tuned to a broadcasting signal of a predetermined receiving frequency by using a phase-locked loop (PLL), an automatic fine-tuning control (AFT) voltage which is output from an integrated circuit for an intermediate frequency (IF IC) is used. Also, when drift occurs at a tuning point due to ambient temperature variations, etc., an automatic fine-tuning control (AFT) voltage is also used in a similar manner.

FIGS. 5A, 5B, and 5C are illustrations showing an example of a signal waveform, a voltage waveform, and a frequency variation state in each section of an electronic tuner when preset automatic tuning is performed in the electronic tuner. FIG. 5A shows a horizontal synchronization signal waveform detected from a received signal. FIG. 5B shows an AFT voice waveform output from an IF IC. FIG. 5C shows an oscillation frequency variation state of a voltage controlled oscillator (VCO), within a PLL, for generating a local oscillation signal.

When preset automatic tuning is performed in the electronic tuner, initially, as shown in FIG. 5C, sweeping of an oscillation frequency is performed by sequentially varying, in a stepped manner, the oscillation frequency of a VCO, within a PLL, for generating a local oscillation signal in units of two steps, for example, in units of (62.5×2) kHz, from lower frequencies (or higher frequencies) every fixed time period A (for example, 200 ms). During the sweeping of this oscillation frequency, as shown in FIG. 5A, a horizontal synchronization signal is detected from a received signal. Next, when the horizontal synchronization signal is detected, as shown in FIG. 5B, the lower level of an S-shaped curve of an AFT voltage output from the IF IC is detected while this horizontal synchronization signal is being monitored. When the lower level of the S-shaped curve of the AFT voltage is detected, the sweeping of the oscillation frequency of the VCO for generating a local oscillation signal is varied, in a direction opposite to that thus far, by one step, for example, by 62.5 kHz. Then, as shown in FIG. 5C, the oscillation frequency of the VCO for generating a local oscillation signal obtained at this time is taken to represent the preset automatic tuning point, and this is stored in a memory, terminating the preset automatic tuning.

While the electronic tuner is operating, if the horizontal synchronization signal cannot be detected, or if the higher level of the S-shaped curve of the AFT voltage which is output from the IF IC exceeds an upper-limit value, for example, 3.0 MHz, an operation for detecting the horizontal synchronization signal is performed again in the electronic tuner.

Next, FIG. 3 is a block diagram showing an example of the construction of a known AFT voltage generating circuit used in an electronic tuner.

FIGS. 4A and 4B are illustrations showing a signal waveform and a voltage waveform, respectively, of each section in the AFT voltage generating circuit shown in FIG. 3. FIG. 4A is a waveform chart of a filtered intermediate video frequency signal. FIG. 4B is a waveform chart of an output AFT voltage.

As shown in FIG. 3, the AFT voltage generating circuit comprises a surface-acoustic-wave (SAW) filter 31, an integrated circuit (IF IC) 32 for an intermediate frequency, a bias setting circuit 33, an intermediate video frequency signal input terminal 34, an AFT voltage using circuit (microcomputer) 35, and a power-supply terminal 36. The IF IC 32 comprises AFT voltage output transistors $32_1$ and $32_2$, and an output buffer resistor $32_3$. The bias setting circuit 33 comprises series voltage-division resistors $33_1$ and $33_2$ having the same resistance values, and an output buffer resistor $33_3$.

The SAW filter 31 is connected at its input end to the intermediate video frequency signal input terminal 34 and is connected at its output end to the input end of the IF IC 32. The IF IC 32 is connected at its AFT voltage output end to the input terminal of the bias setting circuit 33. Inside the IF IC 32, the AFT voltage output transistors $32_1$ and $32_2$ are connected in series between the power-supply terminal 36 and a ground, and the output buffer resistor $32_3$ is connected between the connection point of the two output transistors $32_1$ and $32_2$ and the AFT voltage output end of the IF IC 32. The bias setting circuit 33 is connected at its output end to the input end of the AFT voltage using circuit 35. Inside the bias setting circuit 33, the series voltage-division resistors $33_1$ and $33_2$ are connected between the power-supply terminal 36 and a ground, the connection point of the two resistors $33_1$ and $33_2$ is connected to the input end, and the output buffer resistor $33_3$ is connected between the input end and the output end.

The known AFT voltage generating circuit constructed as described above operates in the following manner.

When an intermediate video frequency signal is input to the intermediate video frequency signal input terminal 34, the intermediate video frequency signal is filtered by the SAW filter 31, and a filtered intermediate video frequency signal, such as that shown in FIG. 4A, is output from the SAW filter 31. The filtered intermediate video frequency signal is detected by the IF IC 32 and an AFT voltage is formed thereby, and the AFT voltage is taken out from the connection point of the two output transistors $32_1$ and $32_2$ through the output buffer resistor $32_3$. The taken-out AFT voltage is supplied to the bias setting circuit 33 whereby, as shown in FIG. 4B, the non-signal-time level is set to an intermediate level of a supplied DC voltage of the power-supply terminal 36, for example, 2.5 V, after which the level is supplied to the using circuit. This AFT voltage is set so that the higher level is the supplied DC voltage of the power-supply terminal 36, for example, a voltage of 3.5 V to 5 V, and the lower level a voltage of 1.5 V or closer to the ground voltage, 0 V.

In this case, as shown in FIG. 4A, the frequency characteristics of the intermediate video frequency signal which is filtered by the SAW filter 31 is such that, since a vestigial sideband system is employed in television broadcasting signals, the frequency band which is higher than the video carrier-wave frequency P is considerably narrower than the frequency band which is lower than the video carrier-wave frequency P. In correspondence with this, as shown in FIG. 4B, the S-shaped curve of the AFT voltage taken out from the bias setting circuit 33 reaches a high level for a relatively long period when the frequency of the frequency band which is lower than the video carrier-wave frequency P is swept. When, in contrast, the frequency of the frequency band higher than the video carrier-wave frequency P is swept, the S-shaped curve of the AFT voltage reaches a lower level for a short period.

In the known AFT voltage generating circuit, since the period at the lower level is much shorter than the period at the higher level in the S-shaped curve of the output AFT voltage, when preset automatic tuning is to be performed by sweeping a local oscillation signal frequency in the VCO within the PLL of the electronic tuner, problems arise in that detection of a lower level in which the period is short cannot be performed, thus the lower level point is passed without being detected, and the position of the low level point is not be stored in a memory. Also, the lower level point may be detected at an incorrect point, the detection point is stored in the memory, and thereafter, preset automatic tuning cannot be performed.

In this case, the manufacturer of the general-purpose IF IC 32 is requested to change a part of the circuit design so that the period at a lower level, of the S-shaped curve of the output AFT voltage is increased. However, when the circuit design of the general-purpose IF IC 32 is changed, new problems arise, for example, the manufacturing cost of the general-purpose IF IC 32 is increased, the general-purpose IF IC 32 may be unavailable, etc.

SUMMARY OF THE INVENTION

The present invention overcomes such problems. An object of the present invention is to provide an AFT voltage generating circuit, in which a general-purpose IF IC is used, which is capable of easily detecting a lower level point in a simple manner without increasing the manufacturing cost.

To achieve the above-mentioned object, the AFT voltage generating circuit in accordance with the present invention has a surface-acoustic-wave filter for filtering an intermediate video frequency signal; an IF IC for generating an AFT voltage in response to the filtered intermediate video frequency signal; and a level shift circuit for shifting the non-signal-time level of the AFT voltage toward a direction in which the level is lower than an intermediate level.

According to the above-described construction, a level shift circuit is used to shift the non-signal-time level of an AFT voltage which is output from an IF IC toward a direction in which the level is lower than an intermediate level, the shifted non-signal-time level is handled as a lower level, and the period of the low level is increased substantially, making it possible to reliably detect the lower level point.

In an aspect of the present invention, the AFT voltage generating circuit comprises a surface-acoustic-wave filter for filtering an intermediate video frequency signal; an IF IC, connected to the surface-acoustic-wave filter, for detecting the filtered intermediate video frequency signal and for generating an AFT voltage; and a level shift circuit, connected to the IF IC, for shifting the non-signal-time level of the AFT voltage generated by the IF IC toward a direction in which the level is lower than an intermediate level.

In an example of an aspect of the present invention, in the AFT voltage generating circuit, a level shift circuit includes series voltage-division resistors for dividing a power voltage unevenly, and an AFT voltage generated by an IF IC is supplied to the connection point of the series voltage-division resistors.

According to these aspects of the present invention, a level shift circuit is connected to an IF IC, and an AFT voltage output from the IF IC is supplied to the level shift circuit, causing the non-signal-time level of the AFT voltage to be shifted toward a direction in which the level is lower than an intermediate level, and this shifted non-signal-time level is handled in a manner similar to that for the lower level. This makes it possible to add the period of the shifted non-signal-time level to the period in which the lower level is short in order to substantially increase the period for the lower level. As a result of the period of the lower level of the AFT voltage being increased, when a local oscillation signal frequency is swept to perform preset automatic tuning, it is possible to reliably detect the lower level point and to store the position of the lower level point in a memory. As a result, it is possible to avoid entering a situation in which preset automatic tuning cannot be performed.

Furthermore, according to these aspects of the present invention, when forming an AFT voltage generating circuit, only a general-purpose IF IC and a level shift circuit are required. Thus, the construction is simple, and the manufacturing cost is less.

The above and further objects, aspects and novel features of the invention will become more apparent from the following detailed description when read in conjunction with the accompanying drawings.

DESCRIPTION OF THE PREFERRED EMBODIMENT

The preferred embodiment of the present invention will be described below in detail with reference to the drawings.

Figure 1:
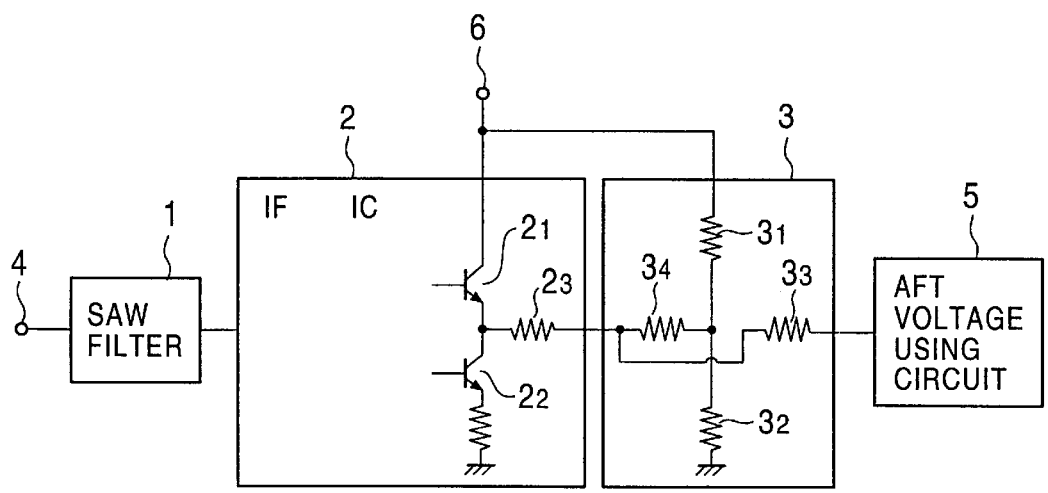
FIG. 1 is a block diagram, partly containing a circuit diagram, showing the construction of an embodiment of an AFT voltage generating circuit according to the present invention.
Figure 2:
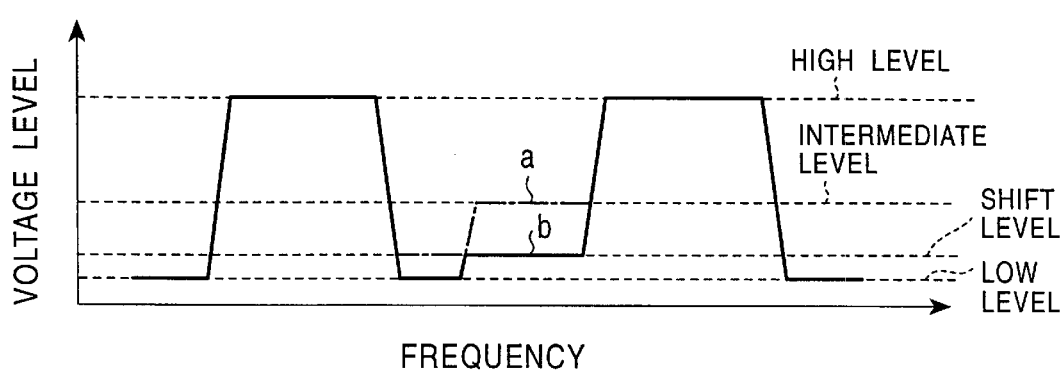
FIG. 2 is a voltage waveform chart showing an AFT voltage output from the AFT voltage generating circuit shown in FIG. 1.
Figure 3:
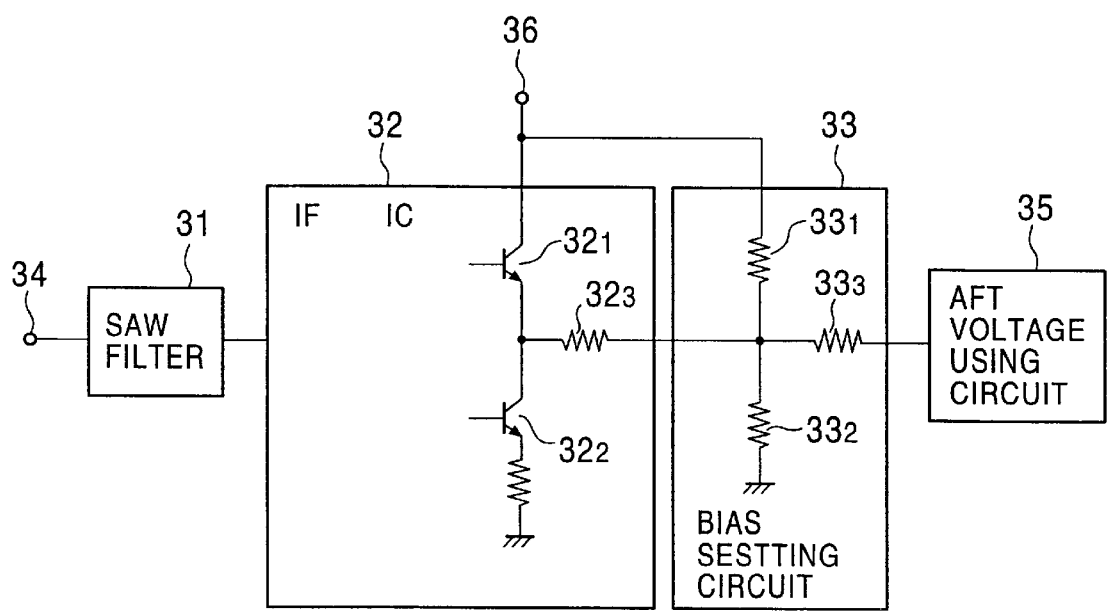
FIG. 3 is a block diagram showing an example of the construction of a known AFT voltage generating circuit used in an electronic tuner.

FIG. 1 is a block diagram, partly containing a circuit diagram, showing the construction of an embodiment of an automatic fine-tuning control (AFT) voltage generating circuit according to the present invention. FIG. 2 is a voltage waveform chart showing an AFT voltage output from the AFT voltage generating circuit shown in FIG. 1.

As shown in FIG. 1, the AFT voltage generating circuit of this embodiment comprises a surface-acoustic-wave (SAW) filter 1, an integrated circuit (IF IC) 2 for an intermediate frequency, a level shift circuit 3, an intermediate video frequency signal input terminal 4, an AFT voltage using circuit (microcomputer) 5, and a power-supply terminal 6. In this case, the IF IC 2 comprises AFT voltage output transistors $2_1$ and $2_2$, and an output buffer resistor $2_3$. The level shift circuit 3 comprises two series voltage-division resistors $3_1$ and $3_2$, an output buffer resistor $3_3$, and a second buffer resistor $3_4$. The two series voltage-division resistors $3_1$ and $3_2$ are selected in such a manner that the resistance value R1 of the voltage-division resistor $3_1$ is larger than the resistance value R2 of the voltage-division resistor $3_2$, specifically, R1=4R2.

The SAW filter 1 is connected at its input end to the intermediate video frequency signal input terminal 4 and is connected at its output end to the input end of the IF IC 2. The IF IC 2 is connected at its AFT voltage output end to the input end of the level shift circuit 3. Inside the IF IC 2, the AFT voltage output transistors $2_1$ and $2_2$ are connected in series between the power-supply terminal 6 and a ground, and the output buffer resistor $2_3$ is connected between the connection point of the two output transistors $2_1$ and $2_2$ and the AFT voltage output end of the IF IC 2. The level shift circuit 3 is connected at its output end to the input end of the AFT voltage using circuit 5. Inside the level shift circuit 3, the two series voltage-division resistors $3_1$ and $3_2$ are connected in series between the power-supply terminal 6 and a ground, the second buffer resistor $3_4$ is connected between the connection point of the two voltage-division resistors $3_1$ and $3_2$ and the input end, and the output buffer resistor $3_3$ is connected between the input end and the output end.

In the above-described construction, the AFT voltage generating circuit of this embodiment operates in the following manner.

Figure 4A:
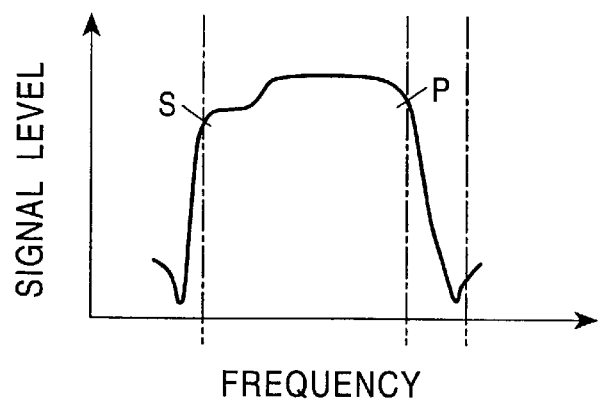
FIGS. 4A and 4B are illustrations showing a signal waveform and a voltage waveform, respectively, of each section in the AFT voltage generating circuit shown in FIG. 3.
Figure 4B:
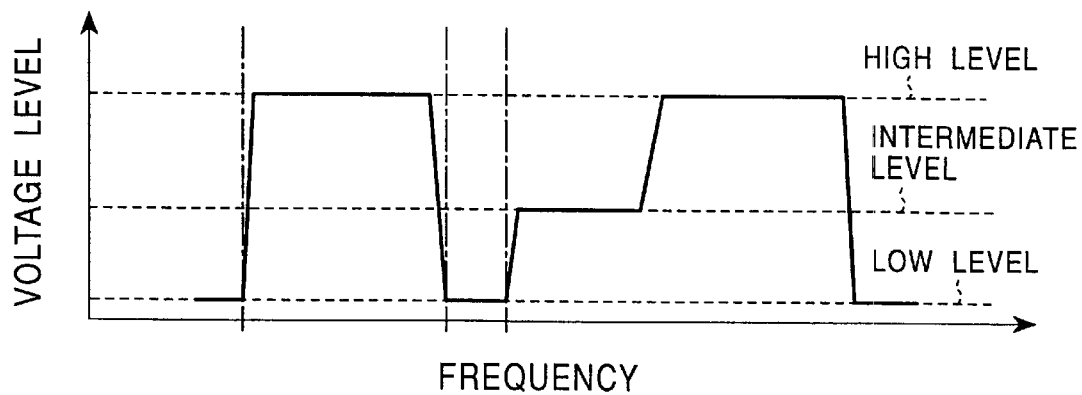
Figure 5A:
FIGS. 5A, 5B, and 5C are illustrations showing an example of a signal waveform, a voltage waveform, and a frequency variation state in each section of an electronic tuner when preset automatic tuning is performed in the electronic tuner.
Figure 5B:
Figure 5C:
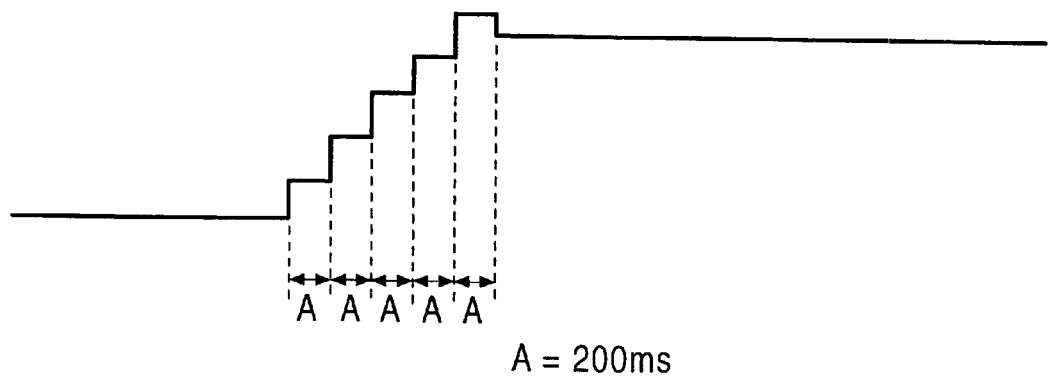

When an intermediate video frequency signal is input to the intermediate video frequency signal input terminal 4, the intermediate video frequency signal is filtered by the SAW filter 1, and in a manner similar to that for a known AFT voltage generating circuit, an intermediate video frequency signal, such as that shown in FIG. 4A, is output from the SAW filter 1. Then, the filtered intermediate video frequency signal is supplied to the IF IC 2. The IF IC 2 detects the supplied, filtered intermediate video frequency signal, forms an AFT voltage in accordance with the filtered intermediate video frequency signal, and outputs the formed AFT voltage from the connection point of the two output transistors $2_1$ and $2_2$ through the output buffer resistor $2_3$. The AFT voltage output from the IF IC 2 is supplied to the level shift circuit 3. In the AFT voltage at this time, the non-signal-time level is at an intermediate level between a high level and a low level, as shown at level a in FIG. 2. Next, the level shift circuit 3 converts the supplied AFT voltage into a shift level in which the non-signal-time level is shifted, by the dividing voltage of the two voltage-division resistors $3_1$ and $3_2$, to a level which is lower than the intermediate level between the high level and the low level, as shown at level b in FIG. 2, after which the shift level is output from the level shift circuit 3 and is supplied to the using circuit 5.

In the AFT voltage generating circuit of this embodiment, if the DC voltage supplied to the power-supply terminal 6 is, for example, 5 V, the AFT voltage output from the IF IC 2 is set so that, for example, the high level is 4.5 V, the low level is 0.5 V, and the intermediate level is 2.5 V. Also, the AFT voltage output from the level shift circuit 3 is set so that the high level becomes 4.5 V, the low level becomes 0.5 V, and the shift level becomes 1.0 V. Thus, the AFT voltage output from the level shift circuit 3 is recognized as a low level if the low level and the shift level are each 1.5 V or lower.

As described above, according to the AFT voltage generating circuit of this embodiment, since the non-signal-time level of the AFT voltage is converted from an intermediate level between a high level and a low level into a shift level closer to a low level so that the non-signal-time level can be handled in a manner similar to that for the low level, the above becomes equivalent to that in which the period of the low level is increased. When the local oscillation signal frequency of a VCO within a PLL of an electronic tuner is swept to perform preset automatic tuning, it is possible to reliably detect the low level point of the AFT voltage and to store the position of the low level point in a memory. As a result, it is possible to avoid an occurrence of a situation in which the electronic tuner cannot perform preset automatic tuning.

Although in the above-described embodiment descriptions are given by using an example in which the respective resistance values R1 and R2 of the two voltage-division resistors $3_1$ and $3_2$ used in the level shift circuit 3 are selected so as to have the relation R1=4R2, the respective resistance values R1 and R2 of the voltage-division resistors $3_1$ and $3_2$ are not limited to these values. As long as these values are used in which the intermediate level of the AFT voltage is shifted to a lower level so that the level can be handled substantially in a manner similar to that for the low level, the resistance values R1 and R2 may be arbitrarily selected.

Also, although in the above-described embodiment descriptions are given by using an example in which the power-supply voltage is 5 V, the higher level is 4.5 V, the lower level is 0.5 V, the intermediate level is 2.5 V, and the shift level is 1.0 V, the power-supply voltage, the higher level, the lower level, the intermediate level, and the shift level in the present invention are not limited to these voltage values, and any desired values may be selected in a range in which these voltages are not changed greatly.

As has been described up to this point, according to the present invention, a level shift circuit is connected to an IF IC, an AFT voltage output from the IF IC is supplied to the level shift circuit, causing the non-signal-time level of the AFT voltage to be shifted toward a direction in which the level is lower than an intermediate level in order to handle this shifted non-signal-time level in a manner similar to that for the low level. Therefore, the period of the shifted non-signal-time level may be added to the period in which the low level is short so as to substantially increase the period of the low level. As a result, since the period of the low level of the AFT voltage is increased, when the local oscillation signal frequency is swept to perform preset automatic tuning, it is possible to reliably detect the low level point and to store the position of the low level point in a memory. As a result, there is the advantage in that it is possible to prevent occurrence of a situation in which preset automatic tuning cannot be performed.

In addition, according to the present invention, when forming the AFT voltage generating circuit, only a general-purpose IF IC and a level shift circuit are required. Therefore, there are advantages in that the construction is simple and the manufacturing cost is less.

Many different embodiments of the present invention may be constructed without departing from the spirit and scope of the present invention. It should be understood that the present invention is not limited to the specific embodiment described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. An automatic fine-tuning control voltage generating circuit comprising:

a surface-acoustic-wave filter filtering an intermediate video frequency signal;

an intermediate frequency integrated circuit connected with said surface-acoustic-wave filter, said intermediate frequency integrated circuit detecting the filtered intermediate video frequency signal and generating an automatic fine-tuning control voltage; and a level shift circuit connected with said intermediate frequency integrated circuit, said level shift circuit shifting an intermediate level of the automatic fine-tuning control voltage generated by said intermediate frequency integrated circuit when no signal is present toward a voltage level lower than the intermediate level.

2. An automatic fine-tuning control voltage generating circuit according to claim 1, wherein said level shift circuit comprises series voltage-division resistors dividing a power-source voltage unevenly; and an automatic fine-tuning control voltage generated by said intermediate frequency integrated circuit is supplied to a connection point of said series voltage-division resistors.

* * * * *